United States Patent
Moradian et al.

(10) Patent No.: US 11,036,125 B2
(45) Date of Patent: Jun. 15, 2021

(54) SUBSTRATE POSITIONING APPARATUS AND METHODS

(71) Applicant: Applied Materials, Inc., Santa Clara, CA (US)

(72) Inventors: Ala Moradian, Sunnyvale, CA (US); Travis Tesch, Campbell, CA (US)

(73) Assignee: Applied Materials, Inc., Santa Clara, CA (US)

(*) Notice: Subject to any disclaimer, the term of this patent is extended or adjusted under 35 U.S.C. 154(b) by 187 days.

(21) Appl. No.: 16/512,705

(22) Filed: Jul. 16, 2019

(65) Prior Publication Data

US 2020/0026177 A1 Jan. 23, 2020

Related U.S. Application Data

(60) Provisional application No. 62/701,274, filed on Jul. 20, 2018.

(51) Int. Cl.
| | |
|---|---|
| *G03F 1/22* | (2012.01) |
| *H01L 21/67* | (2006.01) |
| *H01L 21/673* | (2006.01) |
| *G03F 7/20* | (2006.01) |
| *H01L 21/68* | (2006.01) |
| *G03F 9/00* | (2006.01) |

(52) U.S. Cl.
CPC ............ *G03F 1/22* (2013.01); *G03F 7/70033* (2013.01); *G03F 7/7085* (2013.01); *G03F 7/70733* (2013.01); *G03F 7/70775* (2013.01); *G03F 7/70808* (2013.01); *G03F 9/7011* (2013.01); *H01L 21/673* (2013.01); *H01L 21/67201* (2013.01); *H01L 21/682* (2013.01)

(58) Field of Classification Search
CPC .... G03F 1/22; G03F 7/70033; G03F 7/70733; G03F 7/70775; G03F 7/70808; G03F 7/7085; G03F 9/7011; H01L 21/67201; H01L 21/673; H01L 21/682
USPC ........ 118/668; 355/72, 75, 77; 356/400, 433
See application file for complete search history.

(56) References Cited

U.S. PATENT DOCUMENTS

| | | | |
|---|---|---|---|
| 6,157,450 A | 12/2000 | Marchese-Ragona et al. | |
| 8,314,371 B2 | 11/2012 | Sorabji et al. | |
| 2002/0111710 A1* | 8/2002 | Perlov ................... | H01L 21/681 700/229 |

(Continued)

FOREIGN PATENT DOCUMENTS

| | | | | |
|---|---|---|---|---|
| CN | 107481960 A | * | 12/2017 | ............. H01L 21/67 |
| JP | 2009253286 A | | 10/2009 | |
| KR | 20100026743 A | | 3/2010 | |

OTHER PUBLICATIONS

PCT International Search Report and Written Opinion in PCT/US2019/042147 dated Nov. 6, 2019, 9 pages.

*Primary Examiner* — Colin W Kreutzer
(74) *Attorney, Agent, or Firm* — Servilla Whitney LLC

(57) ABSTRACT

Described herein are apparatus and methods used to process a substrate in a chamber, in particular to position a non-round substrate in a holding chamber or a processing chamber. Further described herein are methods and apparatus that detect radiation transmitted along the thickness of the substrate between the top surface and the bottom surface, determine a signal strength as the substrate is rotated and obtaining a signal strength pattern to determine a position of the substrate within the chamber with respect to a center position.

20 Claims, 7 Drawing Sheets

(56) References Cited

U.S. PATENT DOCUMENTS

2008/0203334 A1 8/2008 Mitsui et al.
2010/0124610 A1 5/2010 Aikawa et al.

* cited by examiner

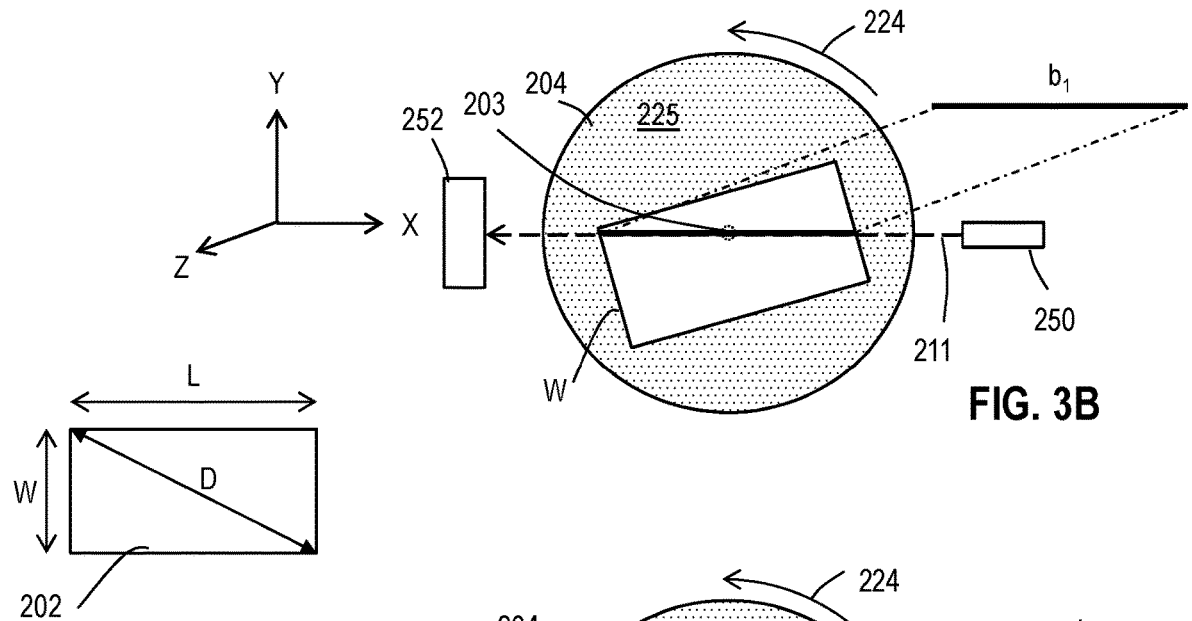
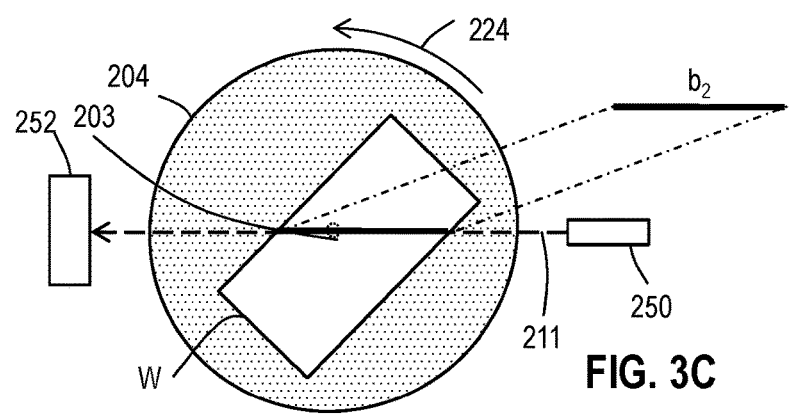
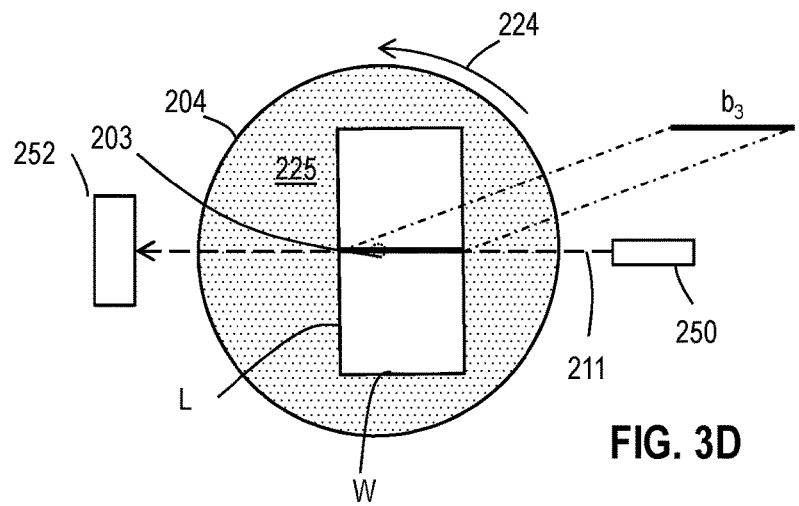
FIG. 3A
FIG. 3B
FIG. 3C
FIG. 3D

SUBSTRATE POSITIONING APPARATUS AND METHODS

TECHNICAL FIELD

Embodiments of the present disclosure relate generally to processing and aligning workpieces such as substrates and, more specifically, to an apparatus and a method for processing workpieces utilizing a positioning apparatus.

BACKGROUND

Integrated circuits are manufactured by processes which involve placement of substrates in chambers including holding or "load lock" chambers and a variety of substrate processing chambers, including, but not limited to deposition chambers, thermal processing chambers, etching chambers, plasma chambers, and other chambers to process a substrate. More than one process may be performed in one chamber. For example, plasma processing, thermal processing and etching may be performed in a single chamber or separate chambers. In many semiconductor processing systems, substrates are supplied to chambers by one or more front opening unified pods (FOUPs) including robotic arms or robot arms. Processing of substrates such as producing patterned material on a substrate requires controlled methods for deposition and removal of exposed material. Before deposition and removal, however, accurate placement of the substrate is an important aspect of process control.

Due to several reasons, such as variations in substrate placement in a FOUP, substrate placement in processing chambers and consistency and repeatability of wafer transfer from robot arms, substrates are not exactly picked and placed similarly. Therefore, there is a possibility that different substrates are not placed exactly at the same position in a process chamber. This can affect yield performance for processes sensitive to slight variation in flow condition, line of sight, or other process-significant physics or chemistry.

Traditionally, detecting a center (or an edge) of a round silicon substrate (also called a wafer) involves using a series of light emitting diodes and sensors, where the wafer blocks the path of light emitted from some of the emitting diodes. This approach is sufficient for round wafers with a sharp edge. However, it has been determined that improved substrate positioning apparatus and methods are required for other generic shapes, such as a polygon, e.g., a rectangular or square substrate, as the traditional methods for detecting the position of round substrates or wafers are inadequate for substrates or wafers that are not round.

SUMMARY

One or more embodiments of the disclosure are directed to substrate processing apparatus comprising a chamber and a substrate support. The substrate support is configured to support a substrate comprising a top surface and a bottom surface defining a substrate thickness. The substrate support is configured to rotate the substrate 360 degrees through a plurality of rotational angular positions within the chamber. A laser is positioned to direct a radiation beam along the thickness between the top surface and the bottom surface. A sensor is positioned opposite the laser to detect radiation transmitted along the thickness of the substrate between the top surface and the bottom surface. A controller is configured to analyze a signal strength of the radiation detected by the sensor at the plurality of rotational angular positions and to correlate the signal strength at the plurality of rotational angular positions to a position within the chamber.

Additional embodiments of the disclosure are directed to extreme ultraviolet (EUV) mask production system. A holding chamber provides access to a substrate handling vacuum chamber including a plurality of ports to provide access to a vacuum chamber including, a physical vapor deposition chamber, a pre-clean chamber, and a multi-cathode PVD chamber. An EUV mask blank loading system is configured to load an EUV mask blank comprising a top surface and a bottom surface defining an EUV mask blank thickness, in at least one of the holding chamber and the vacuum chamber. A substrate support is configured to support and rotate the EUV mask blank 360 degrees through a plurality of rotational angular positions within at least one of the holding chamber the vacuum chamber. A laser is positioned to direct a radiation beam along the thickness between the top surface and the bottom surface. A sensor is positioned opposite the laser to detect radiation transmitted along the thickness of the substrate between the top surface and the bottom surface. A controller is configured to analyze a signal strength of the radiation detected by the sensor at the plurality of rotational angular positions and to correlate the signal strength at the plurality of rotational angular positions to a position within the vacuum chamber.

Further embodiments of the disclosure are directed to methods of positioning a substrate in a chamber. A rectangular substrate is placed in a chamber on a substrate support. The substrate comprises a top surface and a bottom surface defining a substrate thickness. The substrate is rotated 360 degrees through a plurality of rotational angular positions within the chamber. A laser directs a radiation beam along the thickness between the top surface and the bottom surface. Radiation from the radiation beam is transmitted along the thickness of the substrate between the top surface and the bottom surface is detected. The signal strength of the radiation detected at the plurality of rotational angular positions is analyzed and the signal strength is correlated at the plurality of rotational angular positions to a position within the chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate embodiments of this disclosure and are therefore not to be considered limiting of its scope, for the disclosure may admit to other equally effective embodiments.

FIG. 3A is a top plan view of a rectangular substrate that is aligned in an alignment apparatus in accordance with an embodiment of the disclosure;

FIG. 3B is a top plan view of a substrate alignment apparatus showing a rectangular substrate being aligned in accordance with an embodiment of the disclosure;

FIG. 3C is a top plan view of a substrate alignment apparatus showing a rectangular substrate being aligned in accordance with an embodiment of the disclosure;

FIG. 3D is a top plan view of a substrate alignment apparatus showing a rectangular substrate being aligned in accordance with an embodiment of the disclosure;

DETAILED DESCRIPTION

Figure 1:
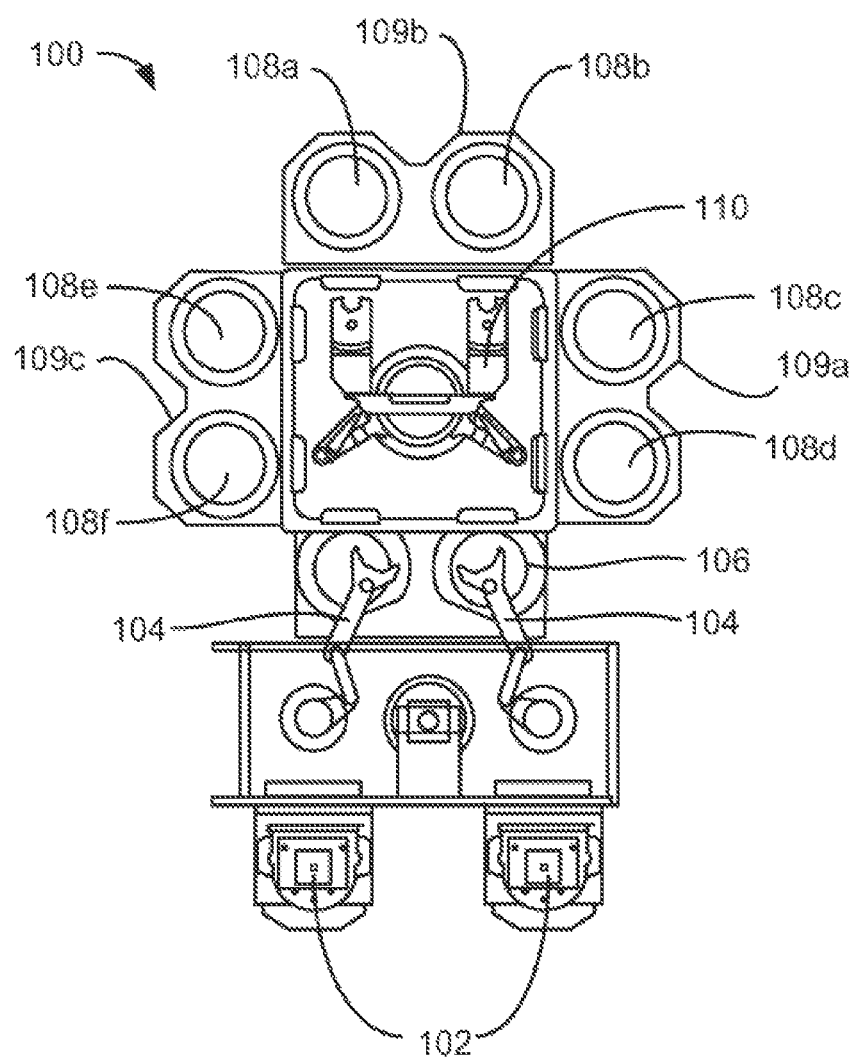
FIG. 1 is a top plan view of one embodiment of an exemplary processing tool that is used in accordance with one or more embodiment of the disclosure.

Various embodiments in accordance with the present disclosure will now be described more fully hereinafter with reference to the accompanying drawings. The workpiece aligner apparatus and methods described herein may be embodied in many different forms and are not to be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts with respect to the geometry and orientation of a component of a device as appearing in the figures. The terminology will include the words specifically mentioned, derivatives thereof, and words of similar meaning and/or significance.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

A "substrate" as used herein, refers to any substrate or material surface formed on a substrate upon which layer processing is performed during a fabrication process. For example, a substrate surface on which processing is performed include materials such as silicon, silicon oxide, strained silicon, silicon on insulator (SOI), carbon doped silicon oxides, amorphous silicon, doped silicon, germanium, gallium arsenide, glass, glass-ceramics, low expansion glass, ultra low expansion glass (e.g., ULE® glass available from Corning, Inc.), Zerodur® low expansion lithium aluminosilicate glass, sapphire, and any other materials such as metals, metal nitrides, metal alloys, and other conductive materials, depending on the application. Substrates include, without limitation, wafers such as semiconductor wafers and wafers made from other types of materials such as the materials listed in the previous sentence. Substrates may be exposed to a pretreatment process to polish, etch, reduce, oxidize, hydroxylate, anneal and/or bake the substrate surface. In addition to layer processing directly on the surface of the substrate itself, in the present disclosure, any of the layer processing steps disclosed may also be performed on an under-layer formed on the substrate as disclosed in more detail below, and the term "substrate surface" is intended to include such under-layer as the context indicates. Thus for example, where a layer (a layer may also be referred to a film) or partial layer has been deposited onto a substrate surface, the exposed surface of the newly deposited layer becomes the substrate surface.

FIG. 1 shows a top plan view of one embodiment of a processing tool or system 100 that is used for processing substrates, including deposition (e.g., chemical vapor deposition, physical vapor deposition, and atomic layer deposition), etching, heating, thermal processing, baking, and/or curing according to one or more embodiments of the disclosure. In the figure, a pair of FOUPs (front opening unified pods) 102 supply substrates (e.g., specified diameter semiconductor wafers) that may be received by first robot arms 104 and placed into a low-pressure holding chamber or holding area (also called a load lock chamber), which will be referred to herein as a holding chamber 106 before being placed into one of the substrate processing sections 108a-f of the process chambers 109a-c. As used herein, a holding chamber 106 is distinguished from process chambers in that a holding chamber is a chamber in which a substrate to be processed is placed before being moved to a process chamber where one or more processes are conducted. A second robotic arm 110 may be used to transport the substrates from the holding chamber 106 to the processing chambers 109a-c and back.

The substrate processing sections 108a-f of the process chambers 109a-c may include one or more system components for depositing (e.g., by chemical vapor deposition, physical vapor deposition, and atomic layer deposition), annealing, heating, thermal processing, curing and/or etching substrates or layers thereon. Thus, the chambers 109a-c may be any of a chemical vapor deposition (CVD) chamber, a physical vapor deposition (PVD) chamber, an atomic layer deposition (ALD) chamber, a flowable chemical vapor deposition (FCVD) chamber, a plasma enhanced chemical vapor deposition (PECVD) chamber, an annealing chamber, a thermal processing chamber, a rapid thermal processing (RTP) chamber, a curing chamber, an etching chamber, or a plasma etching chamber. This list of chambers is exemplary only and non-limiting. Exemplary layers may be flowable dielectrics, multilayer reflective stacks, or absorber layers, but many types of layers may be formed or processed with the processing tool. In one configuration, two pairs of the processing sections of the processing chamber (e.g., 108c-d and 108e-f) may be used to deposit the material on the substrate, and the third pair of processing sections (e.g., 108a-b) may be used to anneal the deposited material. In another configuration, the two pairs of the processing sections (e.g., 108c-d and 108e-f) may be configured to both deposit and anneal a layer on the substrate, while the third pair of processing sections (e.g., 108a-b) may be used for UV or E-beam curing of the deposited layer. In still another configuration, all three pairs of processing sections (e.g., 108a-f) may be configured to deposit and cure a layer on the substrate or etch features into a deposited layer.

In yet another configuration, two pairs of processing sections (e.g., 108c-d and 108e-f) may be used for both deposition and UV or E-beam curing of the layer, while a third pair of processing sections (e.g. 108a-b) may be used for annealing the layer. In addition, one or more of the processing sections 108a-f may be configured as a treatment chamber, and may be a wet or dry treatment chamber. These process chambers may include heating the layer in an atmosphere that includes moisture. Thus, embodiments of system 100 may include wet treatment processing sections 108 *a-b* and anneal processing sections 108*c-d* to perform both wet and dry anneals on the deposited layer. It will be appreciated that additional configurations of deposition, etching, annealing, and curing chambers for layers are contemplated by system 100. In some embodiments, the processing sections are arranged or configured as tandem processing regions or chambers.

In view of the foregoing, an advantage of one or more embodiments of the present disclosure is that a problem with current substrate position detection and alignment apparatus useful for round substrates but not for non-round substrates is solved by providing a system that is configured to detect the position of a non-round substrate and align the substrate. According to one or more embodiments, as used herein, "non-round" refers to shape that is not a circle and includes a square, a rectangle, a triangle, a hexagon, a polygon, a rhombus, and a parallelogram. In specific embodiments the substrate is square or rectangular.

Providing an apparatus that is configured to accurately detect the position of non-round substrates such as polygonal (e.g. rectangular) substrates is very beneficial in the manufacture of elements for extreme ultraviolet lithography (EUV), also known as soft xray projection lithography. EUV has begun to replace deep ultraviolet lithography for the manufacture of 0.13 micron, and smaller, minimum feature size semiconductor devices. EUV systems operate by reflection instead of transmission of light. Through the use of a series of mirrors, or lens elements, and a reflective element, or mask blank, coated with a non-reflective absorber mask pattern, patterned actinic light is reflected onto a resist-coated semiconductor wafer.

Conventional EUV blank processes may include, for example, a 152 mm×152 mm blank reticle being placed into a coating tool to apply various coatings. As configured, the square reticle is sandwiched within a carrier assembly (e.g., a 300 mm carrier assembly) to enable the reticle to be transferred through the coating tool like a 300 mm wafer. The carrier assembly may include a carrier base, the reticle blank, and a carrier shield. During manufacture of a reticle, the carrier assembly may be aligned during the manufacturing process. The apparatus and methods disclosed herein are useful in a variety of semiconductor processing chambers, systems and methods. For example, in deposition and etch processes where detection and/or monitoring of an exact position of the wafer inside the chamber is helpful, as position information directly affects process outcome. For example, placement of certain conducting paths, or etching in multiple chambers depend on capability of repeatable and exact placement of a wafer in a chamber.

Embodiments of the disclosure provide apparatus and methods used to process a substrate in a chamber, in particular to position a non-round substrate in a holding chamber or a processing chamber. Further described herein are methods and apparatus that detect radiation transmitted along the thickness of the substrate between the top surface and the bottom surface, determine a signal strength as the substrate is rotated and obtaining a signal strength pattern to determine a position of the substrate within the chamber with respect to a center position of the chamber. Embodiments of the disclosure enable the detection of whether a substrate is positioned off center in a chamber, and the degree the substrate is positioned off center. While the methods and apparatus are used for any substrate shape, embodiments of the disclosure are useful for substrates having a rectangular shape. The apparatus and methods disclosed herein are useful in a variety of semiconductor processing chambers, system and methods, for example, in deposition and etch processes, wherein it is critical to detect and monitor an exact position of the wafer inside a chamber, as position information directly affects process outcome. For example, placement of certain conducting paths, or etching in multiple chambers depend on capability of repeatable and exact placement of wafer in a chamber. In addition, according to one or more embodiments, it is also possible to detect and quantify bowing and deformation of the substrate in the chamber.

Figure 2A:
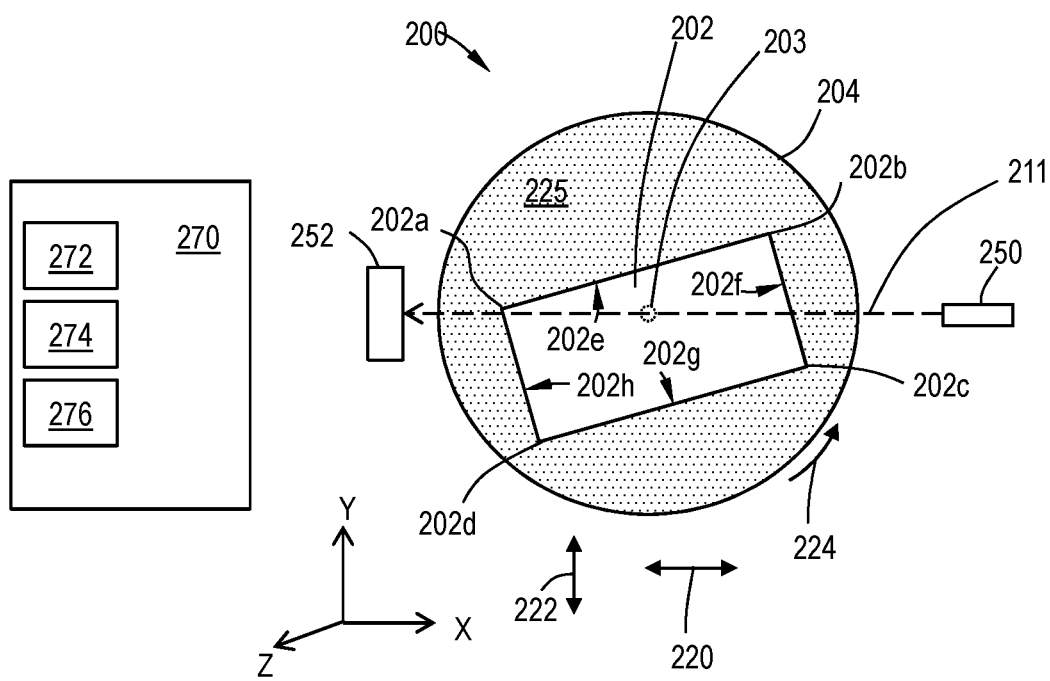
FIG. 2A is a schematic top view of a substrate alignment apparatus according on one or more embodiments of the disclosure.
Figure 2B:
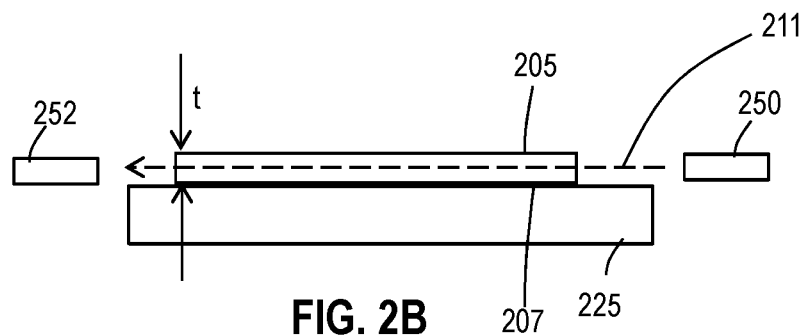
FIG. 2B is a side view of a portion of the substrate alignment apparatus shown in FIG. 2A.

Referring now to FIGS. 2A-B and 3A-D, according to one or more embodiments of the disclosure, a substrate processing apparatus 200 for processing a polygonal substrate, specifically a rectangular substrate 202 is provided. In some embodiments, processing the rectangular substrate 202 involves placing substrate on a chamber surface 204 (e.g., a substrate support 225) that supports the substrate 202. The chamber surface 204 in the plane of the substrate has a center position 203. The substrate 202 shown in FIGS. 2A-B and 3A-D is rectangular in shape and includes a first corner 202*a*, a second corner 202*b*, a third corner 202*c* and a fourth corner 202*d*. A line extending between the first corner 202*a* and second corner defines a first side 202*e*, a line extending between the second corner 202*b* and the third corner 202*c* defines a second side 202*f*, a line extending between the third corner 202*c* and the fourth corner 202*d* defines a third side 202*g*, and a line extending between the fourth corner 202*d* and the first corner 202*a* defines a fourth side 202*h* of the substrate 202. The substrate 202 has a top surface 205 and a bottom surface 207, and a distance between the top surface 205 and the bottom surface define a thickness "t" as shown in FIG. 2B. In one example, the chamber surface 204 is a surface of chamber for processing an EUV reticle or EUV mask, and the substrate 202 is an EUV reticle blank or EUV mask blank.

In some embodiments, the first robot arms 104 and second robot arms 110 shown in FIG. 1 are configured to place the substrate 202 on the chamber surface 204. The first robot arms 104 and the second robot arms 110 move in the substrate 202 in the X-Y plane. Thus, the substrate 202 is moved back and forth in the X direction as shown by arrow 220 and back and forth in the Y direction as shown by arrow 222. Furthermore, the substrate is rotated in the X-Y plane as shown by arrow 224 by either the robot arms or the substrate support 225, which in some embodiments is a rotating substrate support 225. Motion is controlled by drive trains comprising one or more of electric motors, transmissions (e.g., a lead screw), belts and pulleys, linear and rotary bearings and mechanical parts.

Still referring to FIGS. 2A-B and 3A-D, the apparatus 200 includes a position detection system configured to measure the surface profile of a non-round substrate, for example, a polygonal substrate, and in some embodiments, a rectangular transparent substrate 202 as shown. The apparatus comprises a radiation source 250 that scans the substrate 202 and is communication with a controller 270.

The substrate support 225 is configured to rotate the substrate 360 degrees through a plurality of rotational angular positions within the chamber 204. The controller controls the rotation of the substrate support 225. The radiation source 250 in some embodiments is a laser positioned to direct a radiation beam along the thickness "t" between the top surface 205 and the bottom surface 207 as shown by dashed arrow 211. A sensor 252 is positioned opposite the radiation source 250 to detect radiation transmitted along the thickness of the substrate between the top surface and the bottom surface. The controller 270 is configured to analyze a signal strength of the radiation detected by the sensor 252 at the plurality of rotational angular positions and to correlate the signal strength at the plurality of rotational angular positions to a position within the chamber.

The controller 270 is configured to analyze the signal strength of the radiation transmitted along the thickness of a polygonal substrate, such as a rectangular substrate, at the plurality of rotational angular positions. In some embodiments, the controller is configured to analyze the signal strength transmitted along the thickness "t" of a rectangular substrate. In some embodiments, the controller 270 is configured to analyze a signal strength pattern versus a rotational angular position of the substrate as the substrate 202 is rotated through a plurality of rotational angular positions. In some embodiments, the controller 270 controls rotational movement of the substrate support 225.

In some embodiments, the substrate 202 is transparent to the wavelength of radiation 211 emitted by the radiation source 250. In such embodiments, the radiation sensor 252 is positioned opposite the radiation source 250 to detect radiation transmitted along the thickness "t" of the transparent substrate 202. In some embodiments, the radiation source 250 comprises a laser source and the radiation sensor comprises a laser sensor that detects laser radiation. According to one or more embodiments, laser sensors are used for detecting presence of a non-round substrate based on position or light intensity. Benefits of a laser sensor include long range, a visible beam spot and precise detection.

FIG. 3A shows a top plan view of a rectangular substrate 202 similar to the substrate 202 shown in FIGS. 2A-B having a width "W" and a length "L" greater than the width "W," although in some embodiments, the L and W are equal, resulting in the rectangular substrate 202 being a square. The rectangular substrate 202 has a longest dimension along the thickness of the diagonal "D." As seen in FIG. 3B, the substrate 202 is not aligned in the X-Y plane. The controller 270 sends a signal to the radiation source 250 (e.g., a laser source) to transmit a beam of radiation 211 (e.g., laser radiation along the thickness of the substrate 202, which is measured by radiation sensor 252 (e.g., laser sensor)). The FIG. 3B shows as side view of the apparatus 200 with the radiation source 250 emitting radiation 211 that is sensed by the radiation sensor 252 transmitted along the thickness of the substrate 202. A first measurement is taken at a first rotational angular position along the thickness of the substrate as indicated by line $b^1$ in FIG. 3B. In FIG. 3C the controller 270 has sent a signal to rotate the position of the substrate to a second rotational angular position, and the rotational angular position of the substrate 202 has been changed by rotating the substrate support 225 in the direction of arrow 224. The controller 270 sends another signal to the radiation source 250 and the radiation sensor 252 to obtain a second measurement across the substrate 202 as indicated by line $b_2$, which is shorter than $b_1$. As shown in FIG. 3C, the controller sends another signal to the radiation source 250 to transmit a beam of radiation 211 along the thickness of the substrate 202 and the radiation sensor obtains a third measurement along the thickness of the substrate 202 at a distance $b_3$, which is shorter than $b_2$.

Figure 4A:
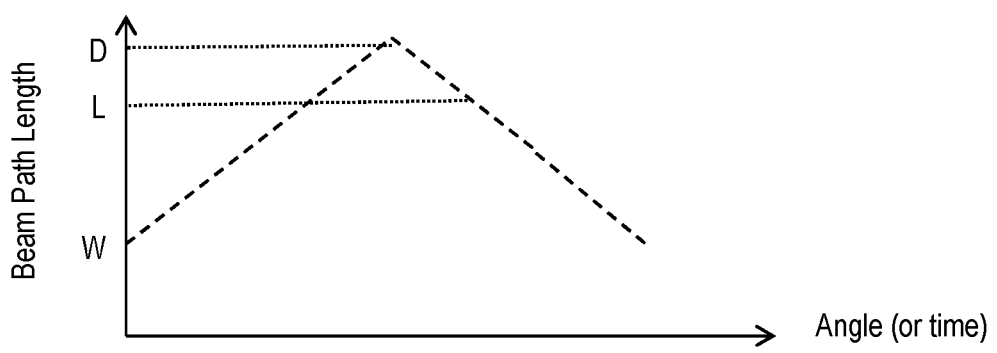
FIG. 4A is a graph of beam path length during a measurement process according to an embodiment.
Figure 4B:
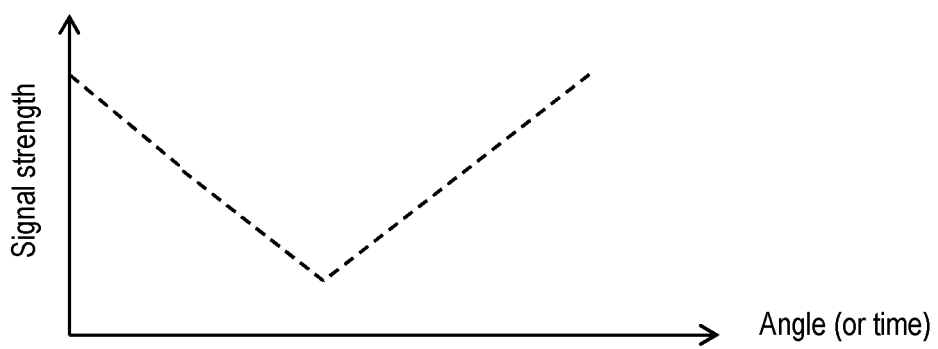
FIG. 4B is a graph of beam signal strength during a measurement process according to an embodiment.

The controller 270 controls rotational motion of the substrate 202 as indicated by arrow 224 as the radiation source 250 scans radiation along the thickness of the substrate 202. It will be understood that the FIGS. 3B-D represent only three measurements along the thickness of the substrate 202, however, in one or more embodiments, the radiation source 250, the radiation sensor 252 and the controller cooperate to obtain a plurality of measurements along the thickness "t" of the substrate 202. The radiation source 250 and the radiation sensor 252 are mounted on a carriage (not shown) that is moved by an electric motor, a pneumatic drive or a hydraulic drive (not shown) to increase or decrease the distance between the radiation source 250 and the radiation sensor, depending on the size of the substrate. The controller 270 includes a central processing unit 272, which is configured to receive radiation intensity measurements from the radiation sensor 252 which are converted to or correlated with signal strength based on the properties of the substrate and the wavelength of the radiation. Depending on the properties of the material (e.g., quartz, glass, etc.), the transmission of the radiation at a particular wavelength is known in advance or is empirically determined for a given path length, as shown in FIG. 4A. Based on the material properties and the path length, the signal strength is determined for a variety of path lengths as shown in FIG. 4B.

The controller 270, including the central processing unit (CPU) 272, further comprises a memory 274 and support circuits 276, and the controller 270 is coupled to the radiation source 250 and the radiation sensor 252 by communication link (not shown) to facilitate control of loading of a substrate, unloading of a substrate, rotation of the substrate during measurement, and repositioning of a substrate placed in a chamber so that the substrate is placed in the center position 203 of the chamber surface 204. The memory 274 is any computer-readable medium, such as random access memory (RAM), read only memory (ROM), floppy disk, hard disk, or any other form of digital storage, local or remote to the apparatus or CPU 272. The support circuits 276 are coupled to the CPU 272 for supporting the CPU 272 in a conventional manner. In some embodiments, these circuits include cache, power supplies, clock circuits, input/output circuitry and subsystem, and the like. A software routine or a series of program instructions stored in the memory 274, when executed by the CPU 272 to cause the apparatus to conduct a measurement at a plurality of rotational angular positions as described with respect to FIGS. 3A-D.

It will be understood that the plurality of measurements along the thickness of the substrate include any suitable number to accurately determine the position of the substrate 202 with respect to a center point 203 of the chamber surface 204. According to one or more embodiments, the measurements are taken in increments of 90 degrees, 45 degrees, 30 degrees, 20 degrees, 15 degrees, 10 degrees, 9 degrees, 8 degrees, 7 degrees, 6 degrees, 5 degrees, 4 degrees, 3 degrees, 2 degrees, 1 degree, 0.5 degrees, 0.1 degrees or 0.01 degrees.

In some embodiments, the controller 270 memory 274 records the signal strength obtained by the radiation sensor 252 at a plurality of rotational angular positions. According to some embodiments, the controller 270 is configured to generate a signal strength pattern at the plurality of rotational angular positions. The signal strength pattern is generated by the CPU 272 processing stored values of signal strength at a plurality of rotational angular positions stored by the memory and generating a plot of signal strength versus rotational angular position as the substrate is rotated 360 degrees.

Figure 5A:
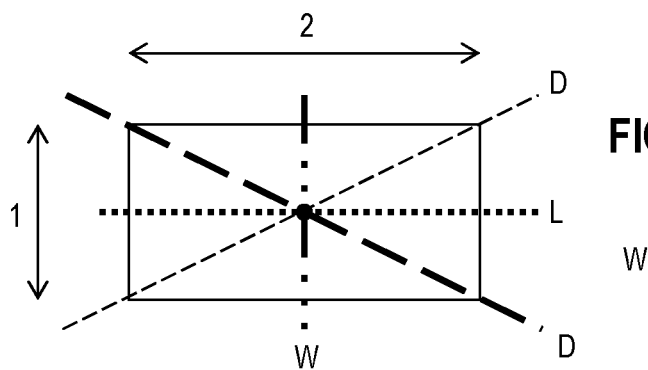
FIG. 5A is a top plan view of a rectangular substrate that is aligned in a substrate alignment apparatus in accordance with an embodiment of the disclosure.
Figure 5B:
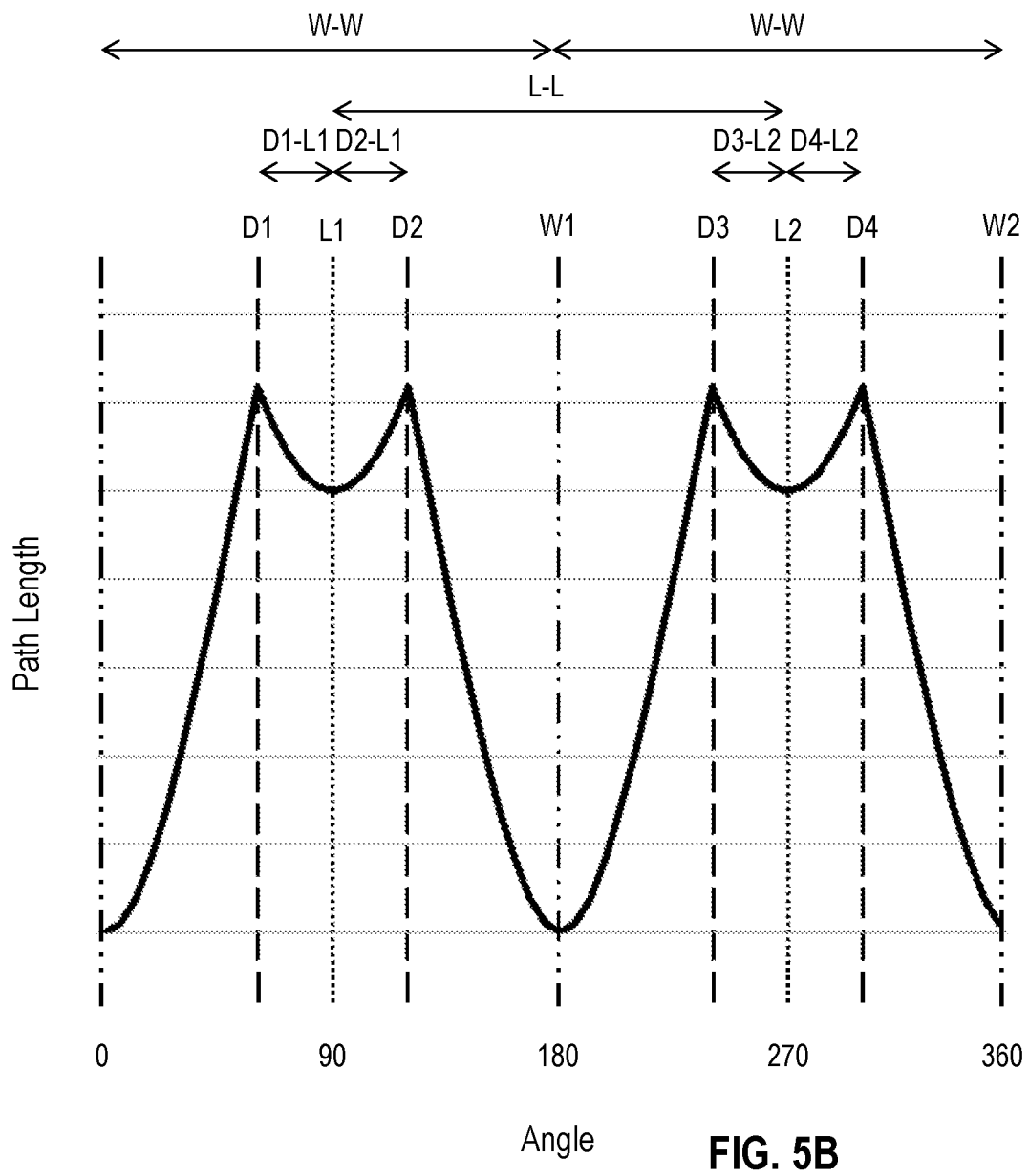
FIG. 5B is a graph of path length versus angle of rotation of the substrate in FIG. 5A.

FIG. 5B shows a representative plot of path length versus rotational angular position as the rectangular substrate shown in FIG. 5A is rotated 360 degrees. The shortest path length is at the width W of the rectangle, and the longest path length is at the length L of the rectangle. As discussed above, the signal strength is inversely proportional to the absorption losses and path length of light pathway along the thickness of the substrate, and therefore, the CPU 272 determines a signal strength that correlates to the path length of each measurement at each rotational angular position as the substrate is rotated. FIG. 5B represents an ideal profile of path length versus angle for a substrate that is perfectly centered in the chamber at the center position 203, as represented by a saw tooth or sinusoidal pattern. Deviation from the pattern shown in FIG. 5B correlated to signal strength is then correlated to eccentricity of the position of the substrate.

Thus, according to some embodiments, placing a rectangular substrate in the chamber and directing a radiation source such as a laser across the chamber and along the thickness of the substrate to a sensor, the eccentricity of the substrate position in the chamber is determined. By rotating the substrate 360 degrees and recording the signal acquired by the radiation sensor, one then determines if the substrate is out of position by comparing the signal strength pattern generated by the CPU versus a known pattern of when the substrate is perfectly centered. For example, if the substrate is in correct position (center point 203) then the signal should have a saw-tooth or sinusoidal. i.e., the beam path will be as short at the width of the substrate and as larger at the diagonal of the substrate.

Figure 6:
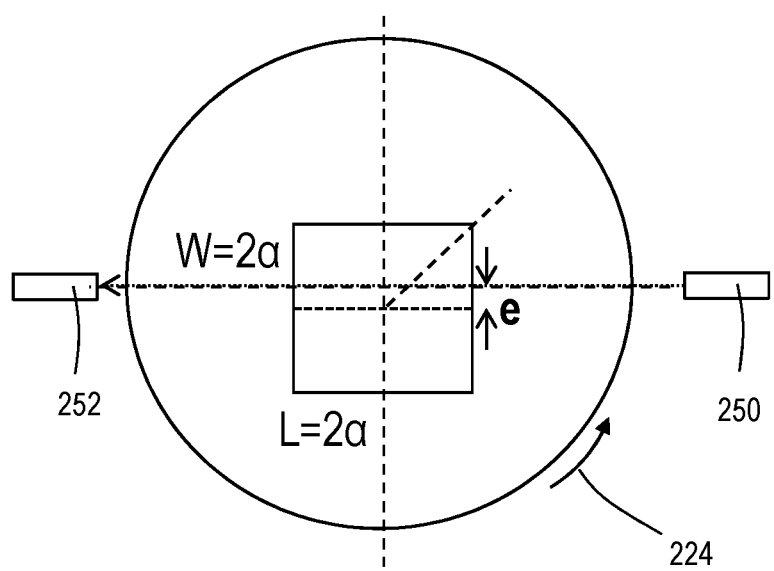
FIG. 6 is a top plan view of a substrate alignment apparatus in accordance with an embodiment of the disclosure.

FIG. 6 illustrates an example of a square substrate 202 having a Width W=2a and a length L=2a. Assuming the substrate is offset from the center in the y direction by the distance "e", as the substrate support of the chamber rotates the path length will be different from a saw tooth or sinusoidal pattern. A maximum will occur at an angle larger than 45 degrees, or $$\theta' := a\tan\left(\frac{a+e}{a}\right) \qquad \text{Eq. 1}$$

When e=0, the maximum should be:

$$L_{max} := \frac{a}{\cos(\theta)} \qquad \text{Eq. 2}$$

However, for the substrate shown in FIG. 6, the maximum is:

$$L'_m := \frac{(a+e)}{\cos(\theta')} \qquad \text{Eq. 3}$$

For a 360 degree rotation, the graph pattern will not be a saw tooth or a controller pattern, and will not repeat four times. In one or more embodiments, when the processor (controller 270) obtains a pattern that does not repeat four times or is not a saw tooth or sinusoidal pattern, or in other words, does not correlate to the signal strength pattern of a pre-determined pattern, the controller 270 will send a signal to adjust the position of the substrate in the chamber because the substrate is not in the center position 203. Accordingly, the controller 270 sends a signal to a robot arm as in FIG. 1 to pick the substrate and place it again closer to the center of the chamber, and the apparatus conducts the measurement to confirm that the substrate 202 has been placed in the center position 203. Thus, in some embodiments, the controller is configured to reposition the substrate 202 in the chamber. The controller sends a signal to a robot arm, for example one of the robot arms described above with respect to FIG. 1 to pick up the substrate and place the substrate closer to or at the center position 203 of the chamber surface 204.

As discussed above, in some embodiments the apparatus according to some embodiments utilizes laser radiation. In one or more embodiments, laser radiation includes the ultraviolet, visible, and infrared regions of the spectrum. In some embodiments, ultraviolet radiation for lasers consists of wavelengths between 180 and 400 nm. In some embodiments, the visible region consists of radiation with wavelengths between 400 and 700 nm. In some embodiments, the infrared region of the spectrum consists of radiation with wavelengths between 700 nm and 1 mm.

Figure 7:
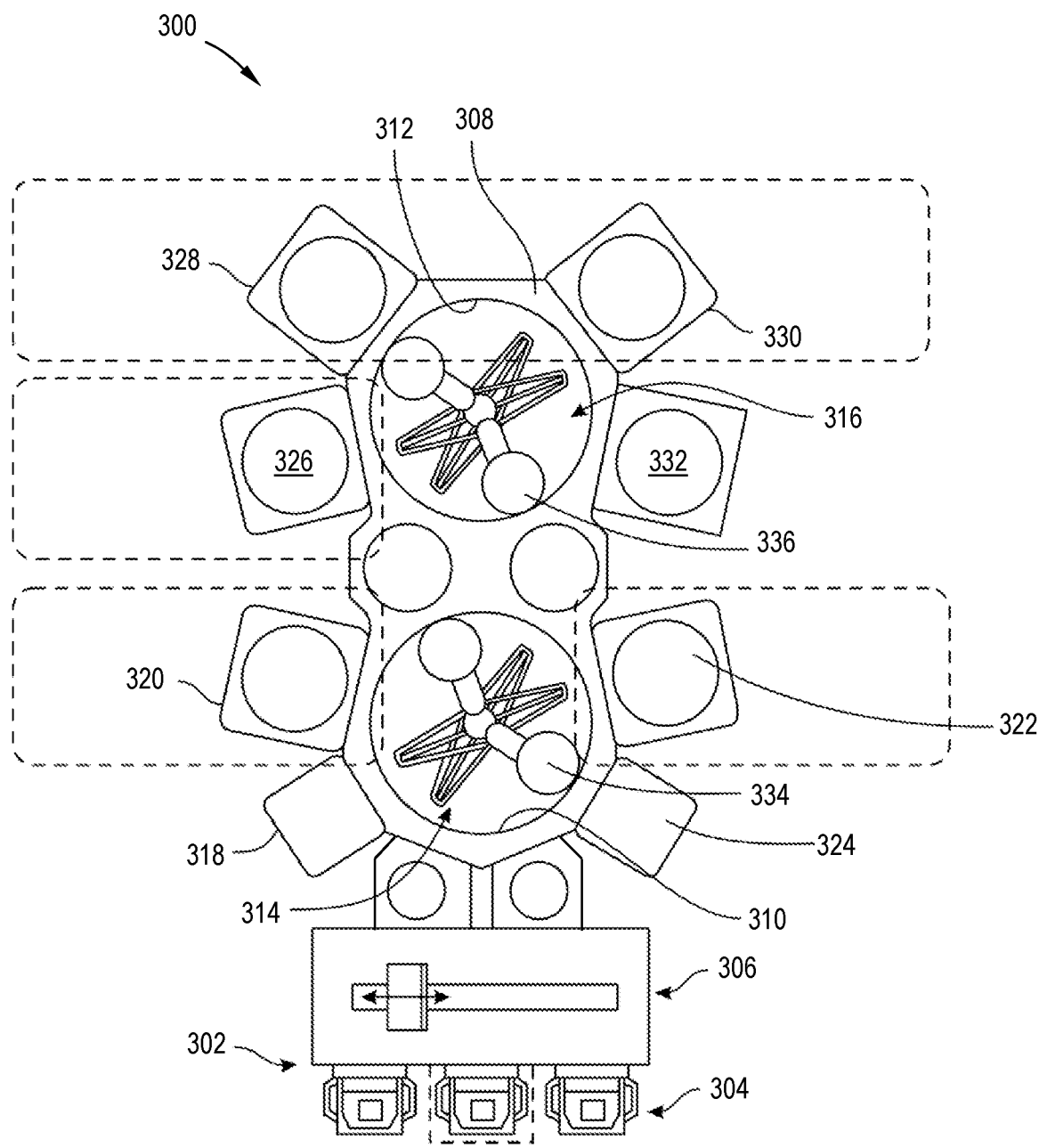
FIG. 7 is a top view of an exemplary substrate processing system in accordance with certain aspects of the present disclosure.

As mentioned above, the apparatus and method are beneficial in the manufacture of EUV devices such as EUV masks. FIG. 7 depicts an EUV mask production system 300, which includes the apparatus 200 for processing a polygonal substrate, for example, a rectangular transparent substrate comprised of quartz, silica, glass or ultra low expansion glass as described herein according to one or more embodiments. The EUV mask production system 300 may include a mask blank loading and carrier handling system 302 configured to receive one or more mask blanks 304 that are polygonal in shape or polygonal in shape and transparent. A holding chamber 306 provides access to a substrate handling vacuum chamber 308. In the embodiment shown, the substrate handling vacuum chamber 308 contains two vacuum chambers, e.g., a first vacuum chamber 310 and a second vacuum chamber 312. Within the first vacuum chamber 310 is a first substrate handling system 314, and in the second vacuum chamber 312 is a second substrate handling system 316.

The substrate handling vacuum chamber 308 may have a plurality of ports around its periphery for attachment of various other systems or chambers and to provide access to these various other systems or chambers. In this non-limiting embodiment, the first vacuum chamber 310 has a degas chamber 318, a first physical vapor deposition chamber 320, a second physical vapor deposition (PVD) chamber 322, and a pre-clean chamber 324. Furthermore, the second vacuum chamber 312 may include a first multi: cathode PVD chamber 326, a flowable chemical vapor deposition (FCVD) chamber 328, a cure chamber 330, and a second multi-cathode PVD chamber 332 connected to the second vacuum chamber 312.

The first substrate handling system 314 is capable of moving substrates, such as a substrate 334, among the holding chamber 306 and the various chambers around the periphery of the first vacuum chamber 310 and through slit valves in a continuous vacuum. The second substrate handling system 316 is capable of moving substrates, such as a substrate 336, around the second vacuum chamber 312, while maintaining the substrates in a continuous vacuum. The integrated EUV mask production system 300 may operate with a reticle processing system. The apparatus 200 for processing a polygonal substrate is utilized adjacent or near the carrier handling system 302. In particular, the three-dimensional (3D) radiation mapping device 260 configured to measure the surface profile of a non-round substrate is used to accurately place the substrates 334 and 336 as described with respect to FIGS. 2 and 3A-B herein in the various chambers, namely the degas chamber 318, the first physical vapor deposition chamber 320, the second physical vapor deposition chamber 322, the pre-clean chamber 324, the first multi-cathode PVD chamber 326, the flowable chemical vapor deposition (FCVD) chamber 328, the cure chamber 330, and the second multi-cathode PVD chamber 332. Accurate placement of the polygonal substrate in one or more of these chambers is critical to meeting production requirements and accurate fabrication of EUV masks and EUV reticles. Existing systems and apparatus are not capable of accurately detecting position and placing non-round substrates, particularly, detecting the position of the substrate relative to a position or point on the robot arm while the substrate is moving, such as when the polygonal substrate is on a robot blade of a robot arm and being moved into a holding chamber or process chamber.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A substrate processing apparatus comprising:
    a chamber;
    a substrate support configured to support a substrate comprising a top surface and a bottom surface defining a substrate thickness, the substrate support configured to rotate the substrate 360 degrees through a plurality of rotational angular positions within the chamber;
    a laser positioned to direct a radiation beam along the thickness between the top surface and the bottom surface;
    a sensor positioned opposite the laser to detect radiation transmitted along the thickness of the substrate between the top surface and the bottom surface; and
    a controller configured to analyze a signal strength of the radiation detected by the sensor at the plurality of rotational angular positions and to correlate the signal strength at the plurality of rotational angular positions to a position within the chamber.

2. The substrate processing apparatus of claim 1, wherein the controller is configured to analyze the signal strength of the radiation transmitted along the thickness of a polygonal substrate at the plurality of rotational angular positions.

3. The substrate processing apparatus of claim 2, wherein the controller is configured to analyze the signal strength transmitted along the thickness of a rectangular substrate.

4. The substrate processing apparatus of claim 3, wherein the controller is configured to analyze a signal strength pattern versus a rotational angular position.

5. The substrate processing apparatus of claim 4, wherein the sensor comprises a laser sensor.

6. The substrate processing apparatus of claim 5, wherein the controller controls rotational movement of the substrate support.

7. The substrate processing apparatus of claim 6, wherein the controller comprises a memory to record a signal strength at a plurality of rotational angular positions.

8. The substrate processing apparatus of claim 7, wherein the controller is configured to generate a signal strength pattern at the plurality of rotational angular positions.

9. The substrate processing apparatus of claim 8, wherein the controller is configured to compare the signal strength pattern to a pre-determined signal strength pattern.

10. The substrate processing apparatus of claim 9, wherein the pre-determined signal strength pattern correlates to the substrate being centered on the substrate support.

11. The substrate processing apparatus of claim 10, wherein the controller is configured to reposition the substrate.

12. An extreme ultraviolet (EUV) mask production system comprising:
    a holding chamber to provide access to a substrate handling vacuum chamber including a plurality of ports to provide access to a vacuum chamber including, a physical vapor deposition chamber, a pre-clean chamber, and a multi-cathode PVD chamber;
    an EUV mask blank loading system configured to load an EUV mask blank comprising a top surface and a bottom surface defining an EUV mask blank thickness, in at least one of the holding chamber and the vacuum chamber;
    a substrate support configured to support and rotate the EUV mask blank 360 degrees through a plurality of rotational angular positions within at least one of the holding chamber and the vacuum chamber;
    a laser positioned to direct a radiation beam along the thickness between the top surface and the bottom surface;
    a sensor positioned opposite the laser to detect radiation transmitted along the thickness of the substrate between the top surface and the bottom surface; and
    a controller configured to analyze a signal strength of the radiation detected by the sensor at the plurality of rotational angular positions and to correlate the signal strength at the plurality of rotational angular positions to a position within the vacuum chamber.

13. The EUV mask production system of claim 12, wherein the controller is configured to analyze the signal strength transmitted along the thickness of a rectangular substrate and to analyze a signal strength pattern versus the plurality of rotational angular positions.

14. The EUV mask production system of claim 13, wherein the controller controls rotational movement of the substrate support, compare the signal strength pattern to a pre-determined signal strength pattern and to reposition the substrate.

15. A method of positioning a substrate in a chamber comprising:
    placing a rectangular substrate in a chamber on a substrate support, the substrate comprising a top surface and a bottom surface defining a substrate thickness;
    rotating the substrate 360 degrees through a plurality of rotational angular positions within the chamber;

directing a laser to direct a radiation beam along the thickness between the top surface and the bottom surface;

detecting radiation from the radiation beam transmitted along the thickness of the substrate between the top surface and the bottom surface; and analyzing a signal strength of the radiation detected at the plurality of rotational angular positions and correlating the signal strength at the plurality of rotational angular positions to a position within the chamber.

16. The method of claim 15, further comprising using a controller to generate a signal strength pattern at the plurality of rotational angular positions.

17. The method of claim 16, further comprising comparing the signal strength pattern to a pre-determined signal strength pattern.

18. The method of claim 17, wherein the pre-determined signal strength pattern correlates to the substrate being at a center position on the substrate support.

19. The method of claim 18, further comprising repositioning the substrate in the chamber to a center position.

20. The method of claim 19, further comprising using a robot arm to reposition the substrate.

* * * * *